US006822997B2

United States Patent
Fujihara et al.

(10) Patent No.: US 6,822,997 B2
(45) Date of Patent: Nov. 23, 2004

(54) SEMICONDUCTOR LASER MODULE AND OPTICAL TRANSMISSION SYSTEM

(75) Inventors: Kiyoshi Fujihara, Otsu (JP); Jun Ohya, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/185,174

(22) Filed: Jun. 28, 2002

(65) Prior Publication Data

US 2003/0001164 A1 Jan. 2, 2003

(30) Foreign Application Priority Data

Jul. 2, 2001 (JP) ........................................ 2001-201090

(51) Int. Cl.$^7$ .............................. H01S 3/00; H01S 3/04
(52) U.S. Cl. ........................................ 372/703; 372/34
(58) Field of Search ............................. 372/703, 34–36

(56) References Cited

U.S. PATENT DOCUMENTS

| 4,981,335 | A | * | 1/1991 | Gaebe .......................... 385/33 |
| 5,123,074 | A | * | 6/1992 | Yokota et al. .................. 385/95 |
| 5,128,956 | A | * | 7/1992 | Aoki et al. ..................... 372/43 |
| 5,195,155 | A | * | 3/1993 | Shimaoka et al. .............. 385/90 |
| 5,359,689 | A |   | 10/1994 | Iwatsuka et al. |
| 5,589,990 | A | * | 12/1996 | Kato et al. ..................... 359/799 |
| 5,812,573 | A | * | 9/1998 | Shiomi et al. .................. 372/44 |
| 6,023,481 | A | * | 2/2000 | Kuribayashi et al. .......... 372/34 |
| 6,155,724 | A | * | 12/2000 | Ichino et al. ................... 385/92 |
| 6,332,721 | B1 | * | 12/2001 | Inokuchi ....................... 385/93 |
| 6,404,042 | B1 | * | 6/2002 | Sone et al. .................... 257/678 |
| 6,488,419 | B2 | * | 12/2002 | Kato et al. .................... 385/93 |
| 6,568,864 | B1 | * | 5/2003 | Ishimaru ....................... 385/93 |
| 6,625,185 | B2 | * | 9/2003 | Ishimaru ....................... 372/36 |
| 6,667,997 | B2 | * | 12/2003 | Nasu et al. .................... 372/32 |
| 6,690,708 | B2 | * | 2/2004 | Ishimaru ....................... 372/108 |
| 6,697,414 | B1 | * | 2/2004 | Kato et al. .................... 372/102 |
| 6,721,511 | B1 | * | 4/2004 | Tatsuno et al. ................ 398/141 |
| 6,765,935 | B2 | * | 7/2004 | Kimura et al. ............... 372/29.02 |
| 2002/0012369 | A1 | * | 1/2002 | Nasu et al. .................... 372/36 |
| 2002/0075914 | A1 | * | 6/2002 | Koyanagi ...................... 372/36 |
| 2002/0186729 | A1 | * | 12/2002 | Nasu et al. .................... 372/34 |
| 2003/0039277 | A1 | * | 2/2003 | Nasu et al. .................... 372/34 |

FOREIGN PATENT DOCUMENTS

| JP | 3-178181 | 8/1991 |
| JP | 6-88926 | 3/1994 |

* cited by examiner

Primary Examiner—Minsun Oh Harvey
Assistant Examiner—Phillip Nguyen
(74) Attorney, Agent, or Firm—Merchant & Gould P.C.

(57) ABSTRACT

The invention provides a semiconductor laser module and an optical transmission system, with which noise caused by light reflected back from a transmission path can be suppressed. The semiconductor laser module, includes a package having a window, a semiconductor laser chip outputting light, a lens that is optically designed such that it couples the light that is output by the semiconductor laser chip into an optical transmission path, an optical isolator that is disposed between the lens and the window, a temperature control mechanism for keeping temperature of these components constant, and a tubular ferrule that is holds and covers the optical transmission path. The semiconductor laser chip, the lens, the optical isolator, and the temperature control mechanism are arranged inside the package. A polarizer is arranged at an end face of the ferrule on the side of the package, such that the polarizer matches a polarization plane of the light that is emitted through the window of the package.

5 Claims, 7 Drawing Sheets

[Fig. 1]
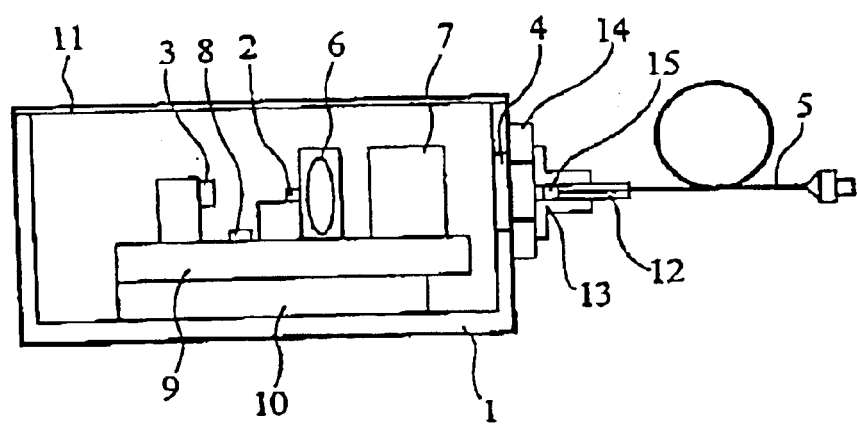
[Fig. 2]
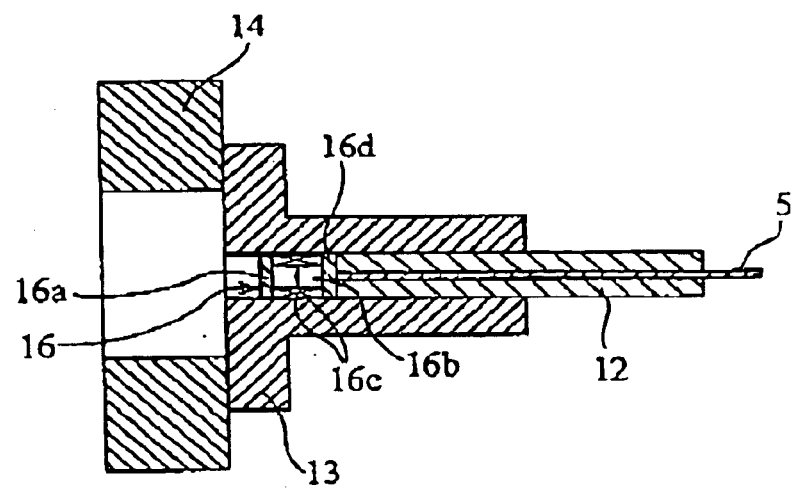

[Fig. 3]
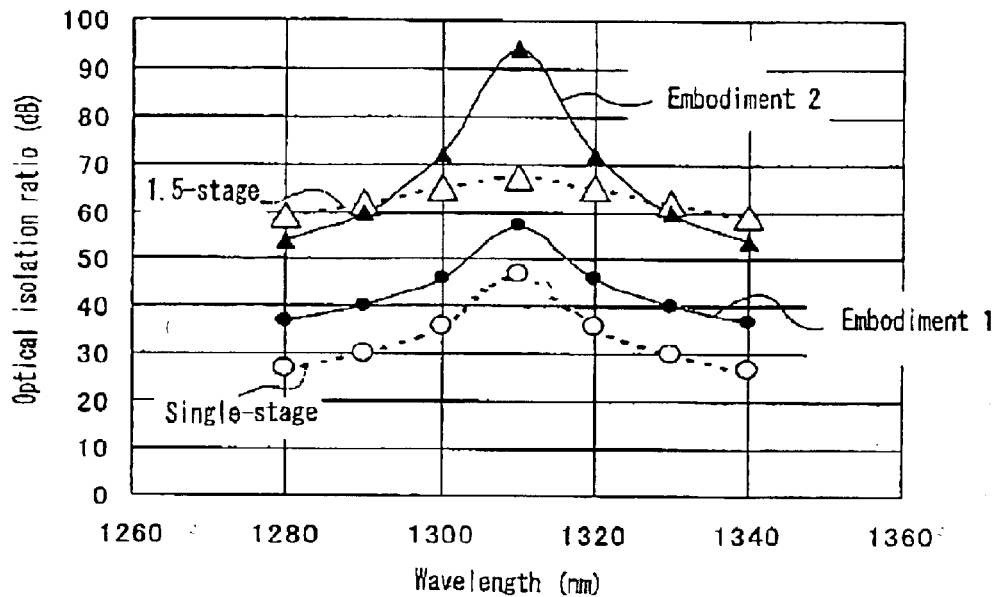
[Fig. 4]
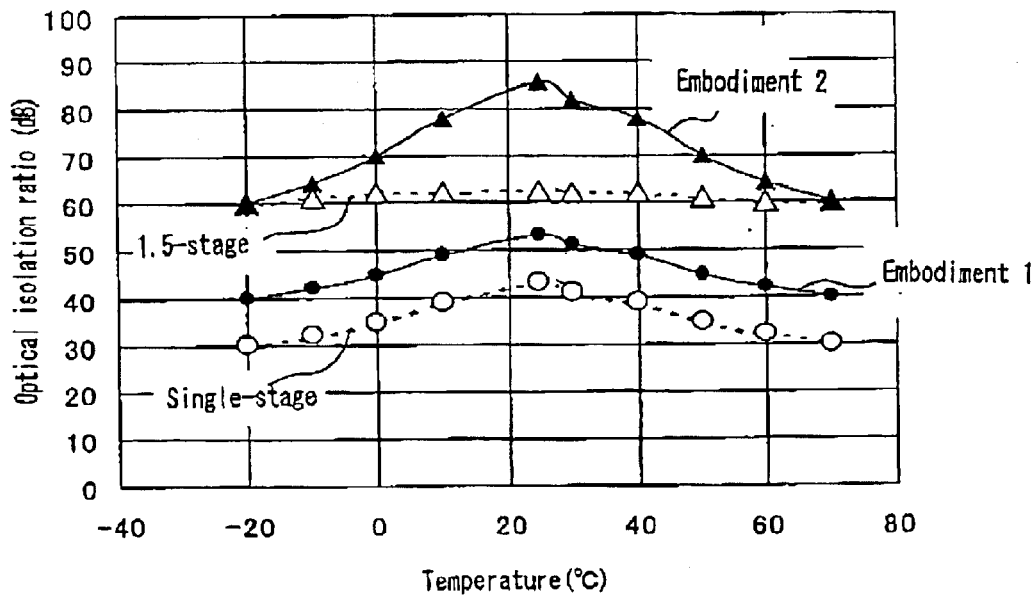

[Fig. 5]
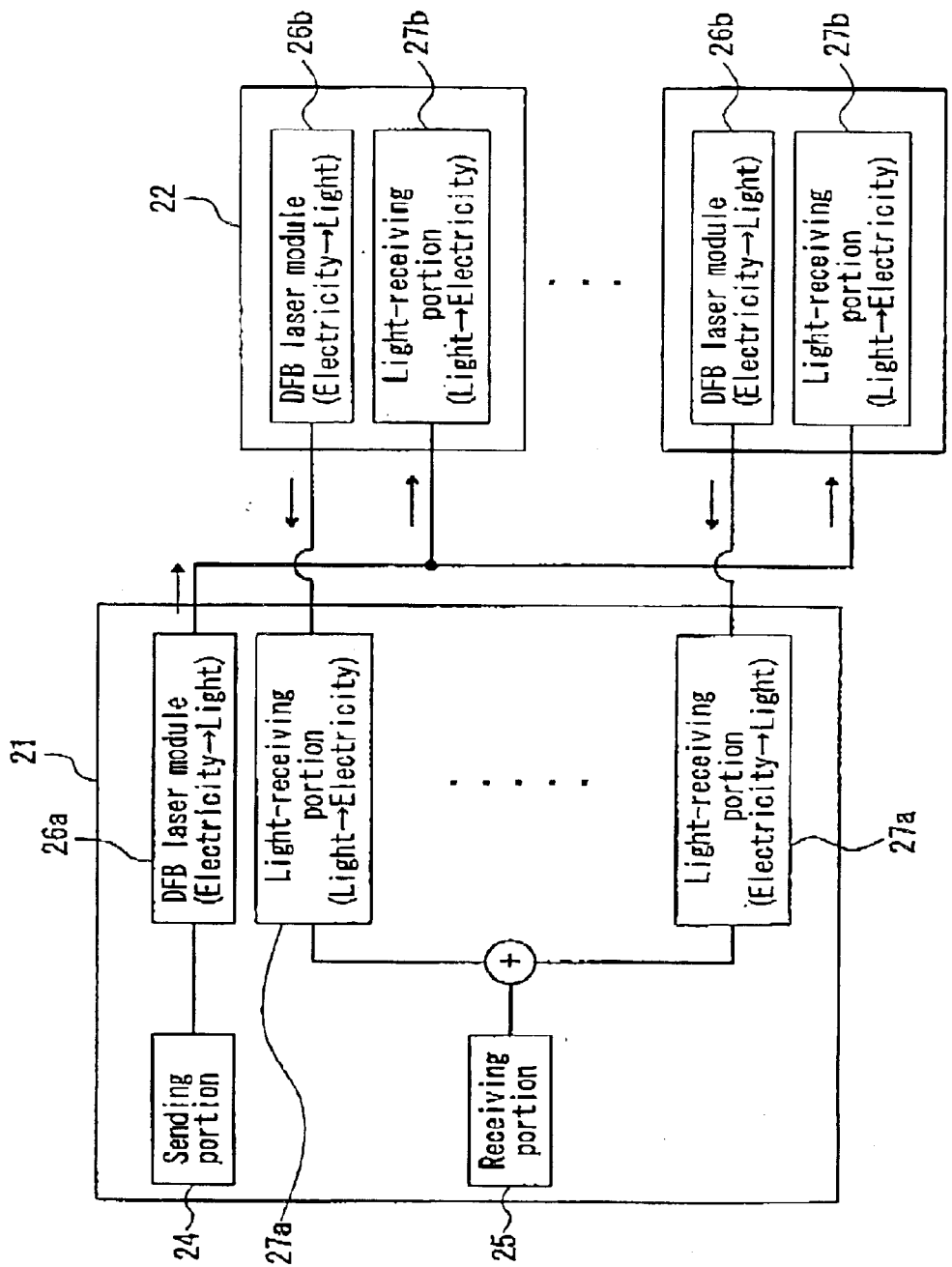

[Fig. 6]
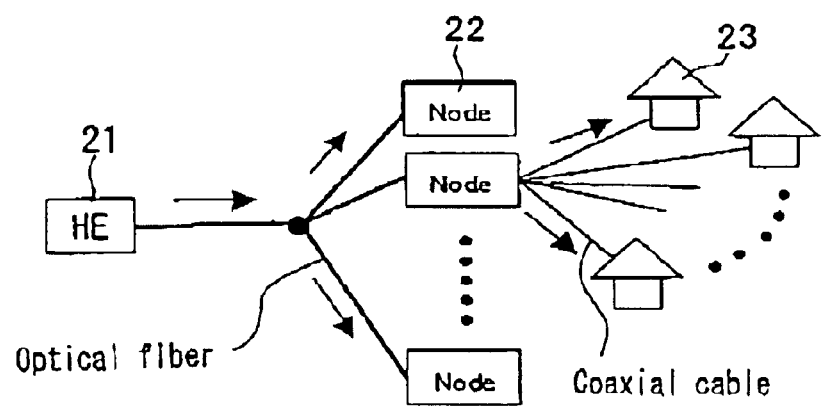
[Fig. 7]
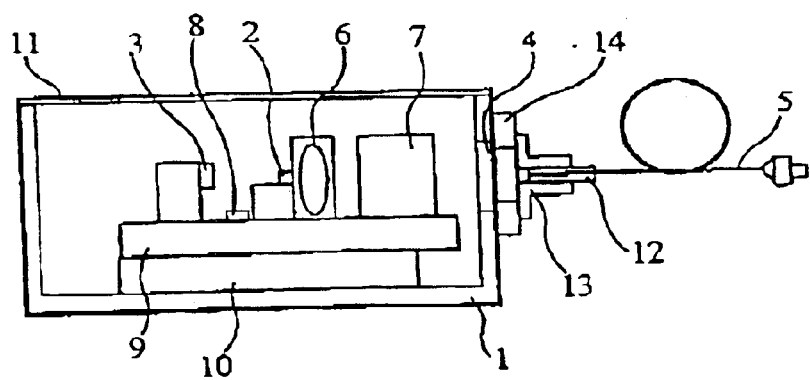

[Fig. 8]
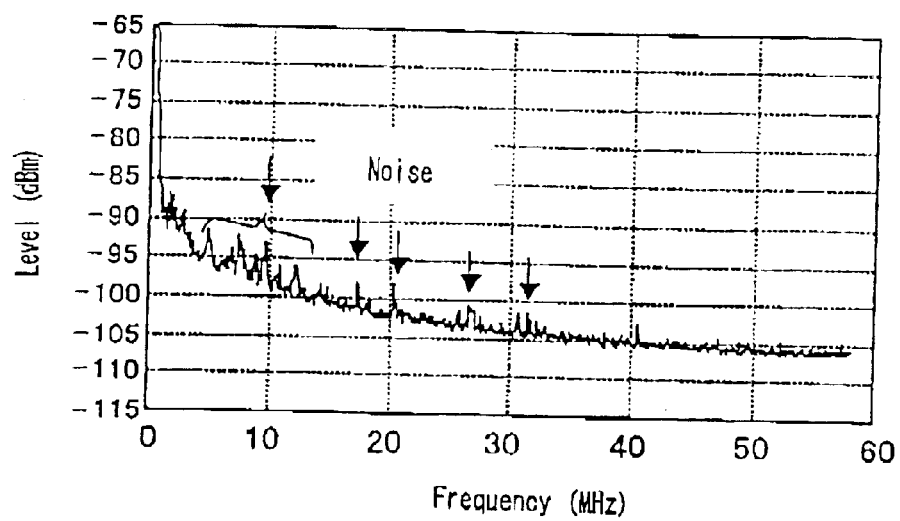
[Fig. 9]
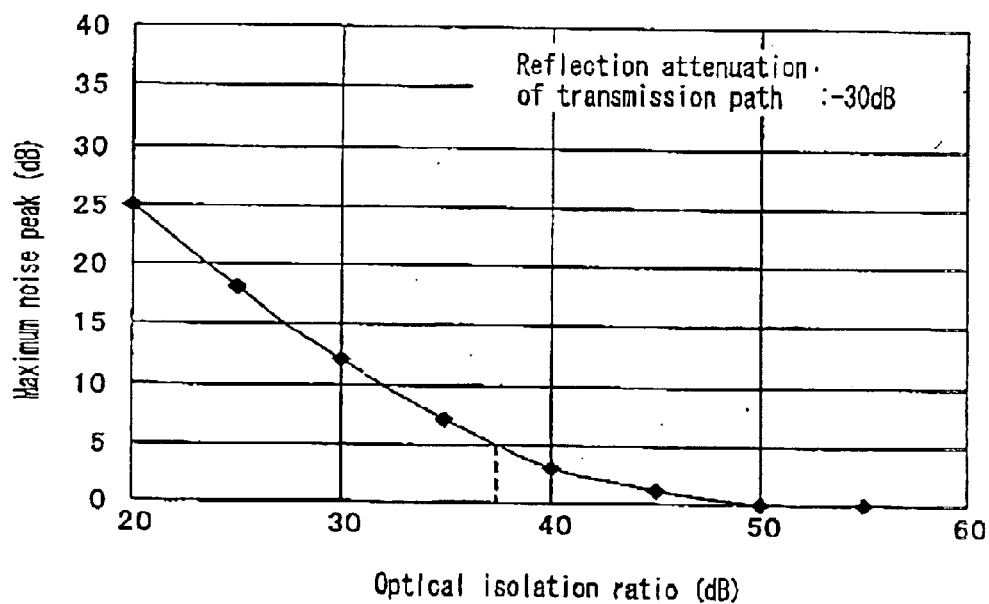

[Fig. 10]
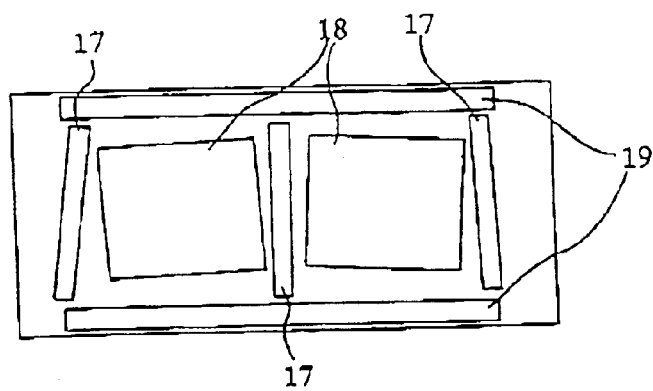
[Fig. 11]
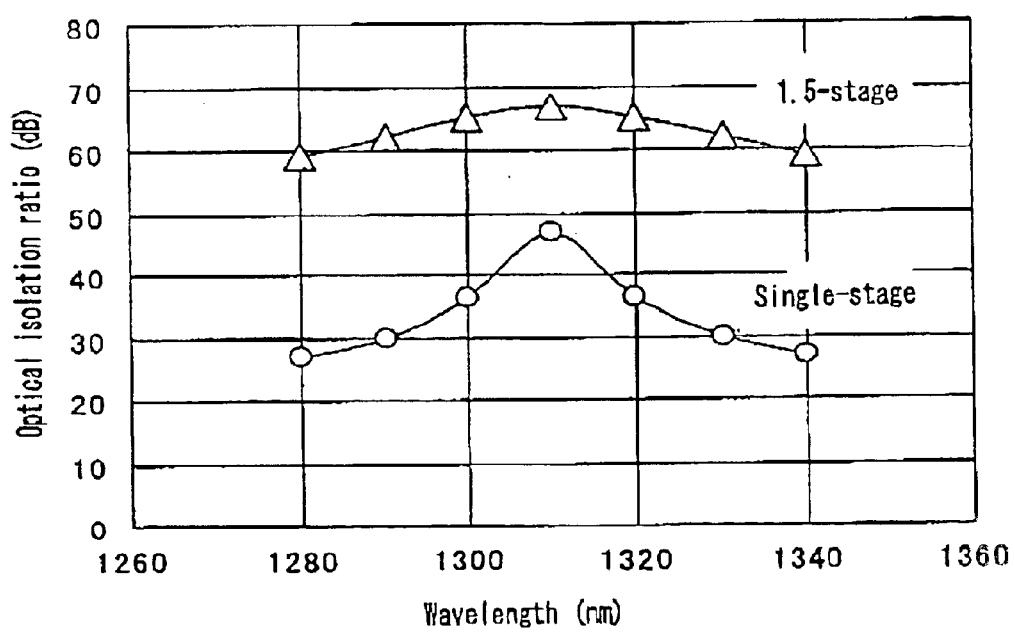

[Fig. 12]
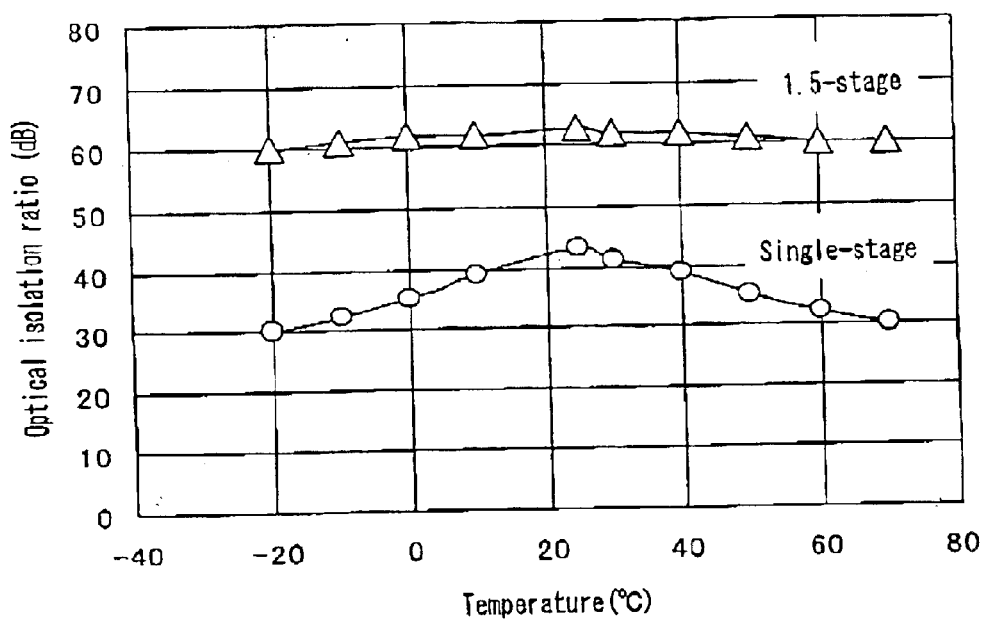

SEMICONDUCTOR LASER MODULE AND OPTICAL TRANSMISSION SYSTEM

BACKGROUND OF THE INVENTION

1. Field of the Invention

The present invention relates to a semiconductor laser module in which a semiconductor laser chip and an optical fiber are optically coupled. In particular, the present invention relates to a semiconductor laser module having an optical coupling mechanism suppressing light that is reflected back from the optical fiber.

2. Description of Related Art

In the course of the development of optical fiber communication networks, optical communication systems with high quality over long distances have been put into practice. In particular in multi-channel CATV video transmissions, optical communication has become necessary and indispensable.

FIG. 6 is a diagram of a conventional optical communication system. This conventional optical communication system is a send-only system, in which video information is distributed from a broadcasting station (referred to as "HE" (head end) in the following) 21 on the sending end to households 23 on the receiving end. Up to the branching points (referred to as "nodes" in the following) 22, the video information signals distributed from the HE 21 are optical signals, transmitted over an optical fiber, and from the nodes 22 to the households 23, they are electrical signals, transmitted over a coaxial cable. A DFB (distributed feedback) laser is used as the semiconductor laser for transmitting the signals in the optical fiber. DFB lasers emit at a single wavelength, so that noise is low, and there is little signal degradation even for long-distance fiber transmissions.

FIG. 7 shows the structure of a conventional semiconductor laser module. The following is an explanation of a conventional semiconductor laser module, with reference to FIG. 7. This semiconductor laser module uses a DFB laser. Inside a package 1, a DFB laser chip 2 outputting DFB laser light, a photo diode 3 monitoring the output from the DFB laser chip 2, an aspheric lens 6 condensing the laser light that is output from the DFB laser chip 2 in order to couple it into the optical fiber 5, an optical isolator 7 for attenuating the light that is reflected back from the optical fiber 5, and a thermistor 8 for detecting the temperature of the DFB laser chip 2 and the optical isolator 7 are arranged on a metal base 9, which is placed on a Peltier cooler 10.

Here, the optical isolator 7 lets laser light pass from the laser chip 2 to the outside of the package 1, but attenuates laser light coming in the other direction from the outside of the package 1. The Peltier cooler 10, made of a Peltier element, controls the temperature of the components on the base 9 to a certain temperature via the base 9. The characteristics of the DFB laser chip 2 and the optical isolator 7 change with the temperature, so they are controlled to the optimum temperature. Furthermore, the temperature is detected by the thermistor 8.

The package 1 is provided with a window 4 through which laser light is emitted to the outside. Moreover, a metal lid 14 is attached to the outer side of the window 4 of the package 1. The package 1 is filled with inert gas, and a cap 11 is welded to the package 1, such that the inert gas does not leak out.

The optical fiber 5 is held by a ferrule 12, which is a stainless steel tube. After the optical fiber 5 has been centered through the ferrule holder 13 such that the laser light emitted through the window 4 is coupled with high efficiency, the optical fiber 5 is held in place by fastening by YAG welding the ferrule 12 to the ferrule holder 13, and the ferrule holder 13 to the metal lid 14 of the package 1.

There are two transmission methods for transmitting DFB laser light over an optical fiber. One is direct modulation, in which the DFB laser is directly modulated, and the other is external modulation, in which the DFB laser is driven by a constant current, and modulated by an external modulator optically connected to the after emitting the laser light from the DFB laser module. Differing from direct modulation, there is no laser chirp with external modulation, so that long-distance transmissions of higher quality become possible.

When using direct modulation, a single mode fiber is used for the optical fiber 5. When using external modulation, a polarization maintaining fiber is used, which can transmit laser light while maintaining its polarization, in order to increase the optical coupling efficiency with the external modulator.

In the semiconductor laser module with the above configuration, the optical isolator 7 is temperature-controlled in the same manner as the DFB laser chip 2, so that a stable optical isolation ratio can be obtained. Therefore, light reflected back from the optical fiber is reliably attenuated by the optical isolator, and noise due to reflected backlight hardly occurs. It should be noted that the above-described semiconductor laser module is disclosed in JP H3-178181A.

However, in the last couple of years, bi-directional optical communication systems, which can be used for the internet or the like, have been required more than send-only systems. FIG. 5 is a diagram of a bi-directional optical communication system using direct modulation. It should be noted that FIG. 5 depicts only the HE 21 serving as the first sending/receiving device and the nodes 22 serving as the second sending/receiving devices, and the households following the nodes 22 have been omitted. As in the system of FIG. 6, also in the system of FIG. 5, the HE 21 and the nodes 22 are linked by an optical transmission path such as an optical fiber. The aspect where the system in FIG. 5 differs from the system of FIG. 6 is that bi-directional communication (i.e. sending and receiving) between the HE 21 and the nodes 22 is possible.

The signals from a sending portion 24 of the HE 21 are converted from electric signals to optical signals by a DFB laser module 26a of the HE 21, and sent to the receiving portions 27b of the nodes 22, where they are converted back from optical signals to electric signals. Furthermore, the optical signals sent from the DFB laser modules 26b of the nodes 22 are converted back into electric signals by the light-receiving portions 27a of the HE 21, and sent to the receiving portion 25.

When the DFB laser modules 26b of the nodes 22 do not send a signal, they are simply in a DC driven (unmodulated) state, and the light reflected back from the optical fiber causes noise in the low-frequency region. FIG. 8 shows the low-frequency noise for a bi-directional optical communication system using an unmodulated DFB laser module. In FIG. 8, it can be seen that spike-shaped noise occurs in the low-frequency region. The HE 21 converts the optical signals from the nodes 22 summarily into electric signals and sends them to the receiving portion 25, so that when signals at frequencies or near the frequencies at which this noise occurs are sent by other nodes 22, those signals are affected by this noise. That is to say, the transmission characteristics of the video or data are deteriorated.

In order to prevent the deterioration of the transmission characteristics, it is necessary to reduce the reflected backlight more than in conventional semiconductor modules. This is achieved mainly by the following two methods.

A first method is to improve the resistance against reflected backlight by always applying a modulation signal of a different signal frequency than that usually used in the upstream laser. However, with this method, the design of the electric circuit of the entire system needs to be improved.

A second method is to use laser modules that provide sufficient optical isolation against light returning from the optical fiber. This method can be accomplished without modifying the system itself, and exchanging only the DFB laser modules.

Consequently, it is easier to employ the second method as a method to prevent the deterioration of transmission characteristics when changing from a conventional send-only system to a bi-directional system.

Incidentally, the reflection attenuation on ordinary optical transmission paths is about −30 dB with respect to the output from the DFB laser module, although this also depends on the kind and number of connectors spliced in between. FIG. 9 shows the relationship between noise and the optical isolation ratio of the DFB module when the reflection attenuation on the transmission path is −30 dB. It can be seen from FIG. 9 that when the optical isolation ratio is 40 dB or more, then noise is reduced considerably, and when it is 45 dB or more, noise is virtually non-existent. In practice, it is desirable that the noise is not greater than 5 dB, so that an optical isolation ratio of at least 38 dB is necessary, as shown in FIG. 9.

When the oscillation peak wavelength of the laser is that of the maximum value of the optical isolation ratio of the optical isolator, then an optical isolation ratio of at least 38 dB is no problem even with a single-stage optical isolator as used conventionally. However, in practice, due to variations of the laser wavelength and individual differences between optical isolators, it is difficult to ensure an optical isolation ratio of 40 dB or more.

Ordinary optical isolators are of the single-stage type, but optical isolators with better characteristics are of the 1.5-stage type. FIG. 10 shows a lateral cross-sectional view of a 1.5-stage optical isolator. Ordinary single-stage optical isolators are made of a Faraday rotator sandwiched between two polarizers, and a magnet applying a magnetic field to the Faraday rotator. The 1.5-stage optical isolator shown in FIG. 10 includes three polarizers 17, two Faraday rotators 18 arranged between the polarizers 17, and magnets 19 applying a magnetic field on the Faraday rotators 18 to control the rotation angle. FIG. 11 shows the wavelength characteristics of the optical isolation ratio. The circles denote the characteristics of a single-stage optical isolator, and the triangles denote the characteristics of a 1.5-stage optical isolator. It can be seen from FIG. 11, that the optical isolation of a 1.5-stage optical isolator is well above 50 dB. Using a 1.5-stage optical isolator, the problem of noise can be solved.

However, 1.5-stage optical isolators are, due to their structure, longer with respect to the light propagation direction than single-stage optical isolators. For this reason, when they are used instead of the optical isolators of the conventional semiconductor modules in FIG. 7, they touch against the window 4. Even when trying to move the other components in order to fit all into the same package 1, there will be laser light that cannot be passed through the optical isolator, because the diameter of the light bundle on the side of the aspheric lens is too large compared to the effective diameter of the optical isolator. Thus, there is the problem that sufficient optical coupling cannot be accomplished.

On the other hand, as another method for reducing the reflected backlight, there are optical fibers having an optical isolator attached to their end face, as disclosed in JP H06-88926A. However, with this structure, the optical isolator is not temperature-controlled, so that the optical isolation ratio is required to be stable with respect to temperature. FIG. 12 shows the temperature characteristics of the optical isolation ratio of optical isolators. From FIG. 12, it can be seen that single-stage optical isolators are instable with respect to temperature changes, whereas 1.5-stage optical isolators are stable with respect to temperature changes, and an optical isolation ratio of at least 45 dB can be ensured. Thus, stabilization with respect to temperature changes can be achieved by a configuration using a 1.5-stage optical isolator. Furthermore, with this configuration, when the optical isolator is placed at a position at which the laser light is sufficiently constricted, optical coupling losses do not occur.

However, since the 1.5-stage optical isolator has a longer structure, the position of the focus of the emitted laser light must be sufficiently removed from the metal lid 14, so that the optical isolator portion does not touch against the window 4 of the package 1. Thus, the distance between the YAG welding joint of the metal lid 14 and the ferrule holder 13 and the focus position becomes large. In that case, when stress deformations with respect to environmental temperature occur in the YAG welding joint, shifts of the focus position become larger than in the case of a single-stage optical isolator. Therefore, with this configuration, defects may occur with a system in which the environmental temperature changes significantly.

Thus, 1.5-stage optical isolators are superior to single-stage optical isolators with regard to wavelength and temperature characteristics, but since they are structurally longer than single-stage optical isolators, the above-described problems occur.

Furthermore, when using not direct modulation but external modulation, an external modulator is connected in front of the DFB laser module, so that there are more reflections than with direct modulation. Consequently, a DFB laser module with a large optical isolation ratio is necessary.

It is an object of the present invention to provide a semiconductor laser module and an optical transmission system, in which noise caused by backlight reflected from the transmission path can be suppressed.

SUMMARY OF THE INVENTION

A semiconductor laser module in accordance with the present invention includes a package, having a window, that is filled with an inert gas and that is sealed airtightly; a semiconductor laser chip outputting light; a lens that is optically designed such that it condenses light that is output from the semiconductor laser chip and couples the condensed light into an optical transmission path outside the window of the package; an optical isolator that is disposed between the lens and the window; a temperature control mechanism for keeping temperature of the semiconductor chip, the lens and the optical isolator constant; and a tubular ferrule that holds and covers the optical transmission path. The semiconductor laser chip, the lens, the optical isolator, and the temperature control mechanism are arranged inside the package, and a polarizer is arranged at an end face of the ferrule on a side of the package, such that the polarizer matches a polarization plane of the light that is emitted through the window of the package. With this configuration, reflected backlight can be attenuated by both the polarizer and the optical isolator, so that noise due to the reflected backlight can be reduced. Moreover, this semiconductor laser module can be obtained by a minor modification of a conventional semiconductor laser module, so that it can be realized easily and at low cost.

It is preferable that the optical transmission path is an optical fiber whose end face on the package side is obliquely ground. With this configuration, laser light emitted from the package can be optically coupled without being reflected at the optical fiber end face.

It is preferable that the optical transmission path is a polarization maintaining fiber. Using a polarization maintaining fiber, the laser light can be transmitted while maintaining its polarization plane. Thus, if the laser light emitted from the semiconductor laser module is modulated by an external modulator, the laser light and external modulator can be optically coupled effectively.

Another semiconductor laser module in accordance with the present invention includes a package, having a window, that is filled with an inert gas and that is sealed airtightly; a semiconductor laser chip outputting light; a lens that is optically designed such that it condenses light that is output from the semiconductor laser chip and couples the condensed light into an optical transmission path outside the window of the package; an optical isolator that is disposed between the lens and the window; a temperature control mechanism for keeping temperature of the semiconductor chip, the lens and the optical isolator constant; and a tubular ferrule that holds and covers the optical transmission path. The semiconductor laser chip, the lens, the optical isolator, and the temperature control mechanism are arranged inside the package, and an external optical isolator is arranged at an end face of the ferrule on the side of the package.

The optical transmission path may be an optical fiber, whose end face on the package side is obliquely ground.

The optical transmission path may be a polarization maintaining fiber.

It is preferable that the external optical isolator includes a first polarizer that lets, of the laser light emitted from the package, only light with a certain polarization pass; a Faraday rotator that rotates the polarization plane of the light that has passed the first polarizer by a certain rotation angle; a magnet that applies a magnetic field to the Faraday rotator; and a second polarizer whose polarization plane matches the polarization plane of the light that passes the Faraday rotator. Thus, reflected backlight can be attenuated.

In an optical transmission system in accordance with the present invention, a first sending/receiving device including one of the above-described semiconductor laser modules and a plurality of second sending/receiving devices including one of the above-described semiconductor laser modules are connected by an optical transmission path, and the first sending/receiving device and the second sending/receiving devices can perform bi-directional communication, sending and receiving optical signals to and from one another. Thus, when using this system for a bi-directional optical communication system, there is little reflected backlight, so that there is little noise, and high-quality optical communication can be attained.

BRIEF DESCRIPTION OF THE DRAWINGS

FIG. 1 is a diagram showing the configuration of a semiconductor laser module in accordance with Embodiment 1 of the present invention.

FIG. 2 is a lateral cross-sectional view of the ferrule in Embodiment 2 of the present invention, and its surroundings.

FIG. 3 is a graph showing the wavelength characteristics of the optical isolation ratio of the present invention.

FIG. 4 is a graph showing the temperature characteristics of the optical isolation ratio of the present invention.

FIG. 5 is a diagram of a bi-directional optical communication system using direct modulation.

FIG. 6 is a diagram of a conventional optical communication system.

FIG. 7 shows the configuration of a conventional semiconductor laser module.

FIG. 8 shows the low-frequency noise for a bi-directional optical communication system using an unmodulated DFB laser module.

FIG. 9 shows the relationship between low-frequency noise and optical isolation ratio.

FIG. 10 shows a lateral cross-sectional view of a 1.5-stage optical isolator.

FIG. 11 shows the wavelength characteristics of the optical isolation ratio for a single-stage and a 1.5-stage optical isolator.

FIG. 12 shows the temperature characteristics of the optical isolation ratio for a single-stage and a 1.5-stage optical isolator.

DESCRIPTION OF THE PREFERRED EMBODIMENTS

Embodiment 1

FIG. 1 is a diagram showing the configuration of a semiconductor laser module in accordance with Embodiment 1 of the present invention. The basic configuration of this semiconductor laser module according to Embodiment 1 of the present invention is similar to the conventional semiconductor laser module shown in FIG. 7 as explained in the background art section. What is different is that, as shown in FIG. 1, a polarizer is disposed at the ferrule end face. The following is an explanation of this semiconductor laser module according to Embodiment 1 of the present invention, with reference to the figure.

Numeral 1 denotes a package of the butterfly type. Numeral 2 denotes a DFB laser chip outputting DFB laser light. Numeral 3 denotes a photo diode for monitoring the output from the DFB laser chip 2. Numeral 6 denotes an aspheric lens that is optically designed such that it converges the laser light that is output from the DFB laser chip 2 and optically couples it into the optical fiber 5 arranged at the outside of the package 1. Numeral 8 is a thermistor detecting temperature.

Numeral 4 denotes a window that is provided such that the laser light that is output by the DFB laser chip 2 is emitted to the outside from the package 1. The laser light is emitted to the outside from the package 1 through the window 4. Numeral 14 denotes a metal lid, which is arranged on the outer side of the package 1 and attached to the window 4.

Numeral 7 denotes an optical isolator, which is made of a Faraday rotator sandwiched between two polarizers and a magnet for applying a magnetic field to this Faraday rotator. The optical isolator 7 is disposed between the lens 6 and the window 4. The optical isolator 7 passes laser light from the laser chip 2 to the outside of the package 1, but it attenuates backlight traveling in the other direction that is reflected back from the optical fiber 5.

The DFB laser chip 2, the photo diode 3, the aspheric lens 6, the optical isolator 7, and the thermistor 8 are placed on a metal base 9. Furthermore, the base 9 is placed on a Peltier cooler 10. In accordance with the temperature detected by the thermistor 8, the Peltier cooler 10 controls the temperature of the components on the base 9 to a constant temperature via the base 9.

The Peltier cooler 10 and the components placed on it are arranged inside the package 1. After filling the package 1 with an inert gas, it is welded shut with a cap 11, so that the inert gas cannot leak out through it. Furthermore, since the window 4 is very air-tight as well, the inert gas will not leak out.

The optical fiber 5 is held by a tubular ferrule 12 made of a stainless steel tube. The ferrule 12 covers the optical fiber 5, starting from its end on the package 1 side. Furthermore, after the optical fiber 5 has been centered through the ferrule holder 13 such that the laser light emitted through the window 4 is coupled with high efficiency, the optical fiber 5 is held in place by fastening by YAG welding the ferrule 12 to the ferrule holder 13, and the ferrule holder 13 to the metal lid 14 of the package 1.

A polarizer 15 is arranged at the end face of the ferrule 12 on the side of the package 1. The polarizer 15 is arranged such it matches with the polarization plane of the laser light emitted from the package 1. An anti-reflection film is formed between the polarizer 15 and the ferrule 12, in order to prevent multiple reflections. It is also possible to prevent multiple reflections by adhering the polarizer 15 and the ferrule 12 by filling an adhesive between the two, using an adhesive whose refractive index is close to that of the polarizer 15 and the optical fiber 5.

In order to suppress reflections of laser light, emitted through the window 4 to the outside of the package 1, at the end face of the optical fiber 5, and to prevent multiple reflections between the optical isolator 7 and the optical fiber 5, the end face of the optical fiber 5 on the side of the package 1 is ground obliquely. Moreover, the above-mentioned optical components arranged inside the package 1 are adjusted and fixed obliquely, such that the laser light emitted through the window 4 to the outside of the package 1 is coupled optimally into the obliquely ground optical fiber 5.

The following is an explanation of the operation of a semiconductor laser module with the above-described structure. Laser light that is output from the DFB laser chip 2 is condensed by the aspheric lens 6, passes through the optical isolator 7, and is emitted through the window 4 to the outside of the package 1. Since the polarizer 15 is arranged to match the polarization plane of the emitted laser light, the emitted laser light passes through the polarizer 15. After passing through the polarizer 15, the emitted laser light is optically coupled into the optical fiber 5, and is transmitted by the optical fiber 5. As explained above, multiple reflections at the end face of the ferrule 12 and the end face of the optical fiber 5 do not occur.

Furthermore, light is reflected back from the optical fiber 5 into the package 1, but this reflected backlight is polarized at random, so that only the correspondingly polarized components are selected when passing through the polarizer 15. Therefore, the optical intensity of the light that is reflected back into the package 1 is attenuated to $1/10$ of that in a conventional semiconductor laser module. Inside the package 1, the reflected backlight is further attenuated by the optical isolator 7.

It should be noted that the characteristics of the DFB laser chip 2 and the optical isolator 7 change with temperature. Therefore, as explained above, the DFB laser chip 2 and the optical isolator 7 are controlled by the Peltier cooler 10 to the temperature at which they operate optimally.

FIG. 3 shows the wavelength characteristics of the optical isolation ratio of the present invention, and FIG. 4 shows the temperature characteristics of the optical isolation ratio of the present invention. It should be noted that in FIGS. 3 and 4, black circles denote the characteristics of the Embodiment 1, and black triangles denote the characteristics of Embodiment 2, which is explained below. For comparison, the characteristics when using only a single-stage optical isolator (shown by circles) and the characteristics when using only a 1.5-stage optical isolator (shown by triangles), as in FIGS. 11 and 12, are shown as well.

As becomes clear from FIGS. 3 and 4, an optical isolation ratio of at least 38 dB is attained with the semiconductor laser module of Embodiment 1, which is due to the effect of the providing a polarizer 15 at the end face of the ferrule 12 and the effect of the optical isolator 7 within the package 1. Thus, noise occurring due to reflected backlight, which was a problem in the related art, can be suppressed. Moreover, the configuration of the semiconductor laser module of Embodiment 1 in FIG. 1 is almost the same as the configuration of the conventional semiconductor laser module in FIG. 7, so that a conventional semiconductor laser module easily can be modified into the semiconductor laser module of Embodiment 1.

Furthermore, when the above-described DFB laser module is used for the bi-directional optical communication system shown in FIG. 5, there is little reflected backlight, so that a high-quality optical transmission system with little noise can be achieved.

Thus, in the semiconductor laser module and optical transmission system in accordance with Embodiment 1 of the present invention, a polarizer 15 is attached to the end face of the ferrule 12, so that a DFB laser module is achieved, in which the light reflected back from the optical fiber 5 is attenuated, and noise is suppressed. Furthermore, this DFB laser module can be obtained using the structure of a conventional semiconductor laser module and without necessitating major modifications, so that it can be accomplished easily and at low cost. Also, a high-quality optical transmission system can be achieved by using this DFB laser module for a bi-directional optical communication system.

Embodiment 2

FIG. 2 is a lateral cross-sectional view of the ferrule in Embodiment 2 of the present invention, and its surroundings. The basic configuration of the semiconductor laser module according to Embodiment 2 of the present invention is the same as that of the DFB laser module according to Embodiment in FIG. 1. What is different is that, as shown in FIG. 2, an optical isolator is disposed at the ferrule end face. The following is an explanation of the semiconductor laser module according to Embodiment 2 of the present invention, with reference to this figure.

As shown in FIG. 2, in the semiconductor laser module according to Embodiment 2, an external optical isolator 16 made of a first polarizer 16a, a Faraday rotator 16b, a magnet 16c, and a second polarizer 16d is disposed at the end face of the ferrule 12. The first polarizer 16a lets only certain polarization components of the laser light emitted from the package 1 pass. The Faraday rotator 16b rotates the laser light that has passed through the first polarizer 16a by a predetermined rotation angle. The magnet 16c applies a magnetic field to the Faraday rotator 16c, and controls the rotation angle. The polarization plane of the second polarizer 16d is set to match the polarization plane of the laser light that has passed the Faraday rotator 16b. With this configuration, the external optical isolator 16 has the function that it lets laser light pass from the package 1 to the optical fiber 5, but attenuates light that is reflected back from the optical fiber 5.

It should be noted that the second polarizer 16d is disposed at the end face of the ferrule 12, but a reflection-preventing film is formed between the ferrule 12 and the second polarizer 16d in order to prevent multiple reflections between the ferrule 12 and the second polarizer 16d. It is also possible to prevent multiple reflections by adhering the ferrule 12 and the second polarizer 16d by filling an adhesive between the two, using an adhesive whose refractive index is close to that of the optical fiber 5 and the second polarizer 16d.

After the laser light emitted to the outside from the package 1 has passed through the external optical isolator 16, it is optically coupled into the optical fiber 5, and transmitted by the optical fiber 5. Furthermore, light is reflected from the optical fiber 5 back into the package 1, but the reflected backlight of the laser light emitted from the package 1 is attenuated by the external optical isolator 16, and further attenuated by the optical isolator 7 inside the package 1. FIGS. 3 and 4 show wavelength and temperature characteristics of the optical isolation ratio for this case. As above, the optical isolation ratio of Embodiment 2 is marked by black triangles in FIGS. 3 and 4.

As shown in these drawings, due to the effect of the providing an external optical isolator 16 at the end face of the ferrule 12 and the effect of the optical isolator 7 within the package 1, characteristics that are superior to that of a 1.5-stage optical isolator can be attained, so that an optical isolation ratio that is stable over a broad range of temperatures and wavelengths can be achieved. Thus, the occurrence of noise, which is a problem in the related art, can be suppressed. Moreover, the configuration of the semiconductor laser module of Embodiment 2 is almost the same as the configuration of the conventional semiconductor laser module, so that the semiconductor laser module of the related art can be modified easily at low cost.

Furthermore, a sufficient optical isolation ratio can be attained with the semiconductor laser module of Embodiment 2, so that it is desirable to use it in particular with external modulation for long-distance transmissions. In external modulation, the laser light emitted from the DFB laser module is modulated by an external modulator. In this case, a polarization maintaining fiber is used for the optical fiber 5, in order to increase the optical coupling with the external modulator.

Also, when the above-described DFB laser module is used for the bi-directional optical communication system shown in FIG. 5, there is little reflected backlight, so that a high-quality optical transmission system with little noise can be achieved.

Thus, in the semiconductor laser module and optical transmission system according to Embodiment 2 of the present invention, an external optical isolator 16 is attached to the end face of the ferrule 12, thus reducing the light that is reflected back from the optical fiber 5, and achieving a DFB laser module with which noise is suppressed. Furthermore, it can be accomplished using the structure of a conventional semiconductor laser module and without necessitating major modifications, so that it can be achieved easily and at low cost. Furthermore, a high-quality optical transmission system can be achieved by using this DFB laser module to configure a bi-directional optical communication system.

As described above, in a semiconductor laser module in accordance with the present invention, in which laser light that is output from a semiconductor laser chip inside a package is emitted to the outside and optically coupled into a transmission path, a polarizer is disposed at the end face of the ferrule holding the optical transmission path on the package side, so that reflected backlight can be attenuated and noise can be suppressed. Furthermore, the semiconductor laser module can be realized using a conventional semiconductor laser module and without major modifications, so that it can be achieved easily and at low cost. Moreover, a high-quality optical transmission system can be achieved by using this semiconductor laser module to configure a bi-directional optical transmission system.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A semiconductor laser module, comprising
   a package that is filled with an inert gas and that is sealed airtightly, the package having a window;
   a semiconductor laser chip outputting light;
   a lens disposed at the inside of the package that is optically designed such that it condenses light that is output from the semiconductor laser chip and couples the condensed light into an optical transmission path outside the window of the package;
   an optical isolator that is disposed between the lens and the window at the inside of the package;
   a temperature control mechanism for keeping temperature of the semiconductor chip, the lens and the optical isolator constant; and
   a tubular ferrule that holds and covers the optical transmission path;
   the semiconductor laser chip, the lens, the optical isolator, and the temperature control mechanism being arranged inside the package;
   wherein an external optical isolator is arranged at an end face of the ferrule on the side of the package at the outside of the package.

2. The semiconductor laser module according to claim 1, wherein the optical transmission path is an optical fiber whose end face on the package side is obliquely ground.

3. The semiconductor laser module according to claim 1, wherein the optical transmission path is a polarization maintaining fiber.

4. The semiconductor laser module according to claim 1, wherein the external optical isolator comprises:
   a first polarizer that lets, of the laser light emitted from the package, only light with a certain polarization pass;
   a Faraday rotator that rotates the polarization plane of the light that has passed the first polarizer by a certain rotation angle;
   a magnet that applies a magnetic field to the Faraday rotator; and
   a second polarizer whose polarization plane watches the polarization plane of the light that passes the Faraday rotator.

5. The semiconductor laser module according to claim 1, wherein the external optical isolator is a polarizer arranged at an end face of the ferrule on the side of the package, such that the polarizer matches a polarization plane of the light that is emitted through the window of the package.

* * * * *